United States Patent [19]

Suzuki

[11] Patent Number: 5,041,945

[45] Date of Patent: Aug. 20, 1991

[54] ELECTROMAGNETIC WAVE SHIELD TYPE CIRCUIT UNIT AND TV GAME PLAYING MACHINE CIRCUIT UNIT UTILIZING THE SAME

[75] Inventor: Toshio Suzuki, Zushi, Japan

[73] Assignee: Namco Ltd., Tokyo, Japan

[21] Appl. No.: 541,964

[22] Filed: Jun. 22, 1990

[30] Foreign Application Priority Data

Jun. 26, 1989 [JP] Japan .................. 1-75414[U]

[51] Int. Cl.⁵ ............................................. H05K 9/00
[52] U.S. Cl. ..................................... 361/424; 361/399
[58] Field of Search ............ 361/391, 395, 399, 412, 361/414, 415, 424; 174/35 R X, 35 R; 29/626; 439/547; 235/492; 211/41

[56] References Cited

U.S. PATENT DOCUMENTS

| | | | |
|---|---|---|---|
| 3,668,476 | 6/1972 | Wrabel et al. | 29/626 |
| 4,149,027 | 4/1979 | Asher et al. | 361/399 |
| 4,628,412 | 12/1986 | Nigorikawa | 361/424 |

FOREIGN PATENT DOCUMENTS

| | | |
|---|---|---|
| 7148246 | 5/1973 | Fed. Rep. of Germany . |
| 2822968 | 11/1978 | Fed. Rep. of Germany . |
| 3228398 | 2/1984 | Fed. Rep. of Germany . |

*Primary Examiner*—Leo P. Picard
*Assistant Examiner*—Donald A. Sparks
*Attorney, Agent, or Firm*—Oliff & Berridge

[57] ABSTRACT

The present invention provides an electromagnetic wave shield type circuit unit including a circuit substrate and an electromagnetic wave shield casing, the circuit substrate being fixedly mounted in the shield casing through mounting members such that the electromagnetic waves can be prevented from leaking externally out of the circuit unit. The circuit unit is provided, at each side, with a terminal region having a plurality of externally connecting terminals, a circuit region on which various circuits are mounted and a mounting region between the terminal and circuit regions. The mounting members include a pair of shield plates each having at least one strip-like portion fixedly mounted on the circuit substrate across the width thereof in the corresponding mounting region. These shield plates sandwich the circuit substrate from its opposite sides such that the circuit substrate is fixedly received within the electromagnetic wave shield casing with the terminal regions thereof exposed externally. Even if the terminal regions of the circuit substrate are externally exposed out of the shield casing, the external leakage of electromagnetic waves from the shield casing can be reduced greatly.

20 Claims, 6 Drawing Sheets

ELECTROMAGNETIC WAVE SHIELD TYPE CIRCUIT UNIT AND TV GAME PLAYING MACHINE CIRCUIT UNIT UTILIZING THE SAME

BACKGROUND OF THE INVENTION

1. Field of the Invention:

The present invention relates to an electromagnetic wave shield type circuit unit, and particularly to an electromagnetic wave shield type circuit unit capable of preventing the external leakage of electromagnetic wave from a circuit substrate mounted on an electromagnetic wave shield casing and an improved TV game playing machine circuit unit utilizing the same.

2. Description of the Related Art:

With the advance of electronic technique, substrates on which electronic circuits and the like are mounted are increasingly used for various modern electronic/electric instruments, particularly for TV game playing machines.

However, noise is frequently created by electromagnetic waves leaked from various components in such electronic circuits on the circuit substrates. Such noise may interfere with the operation of the other electronic instrument located adjacent to such an electronic instrument, leading to malfunction.

In order to avoid such noise, there have been broadly used circuit units which use electromagnetic wave shield casings. Typically, such a circuit unit includes a circuit substrate fixedly mounted in the shield casing and adapted to prevent the electromagnetic waves from leaking out of the casing.

However, such a circuit unit requires a slitted window formed in the shield casing, through which the end of the circuit substrate having external connection terminal means can extend outwardly. This means that electromagnetic waves leak externally through the slitted window in the shield casing.

FIGS. 9 and 10 in the accompanying drawings show an example of the conventional circuit units used in the prior art, as described in Japanese Utility Model Publication No. 3356/1982.

In these figures, reference numeral 1 denotes a shield casing of electrically conductive material, which has a slitted window 2 formed therein. The casing 1 receives a circuit substrate A through the slitted window 2. The shield casing 1 comprises a main body 1' and a lid 1", which are detachably connected with each other to form the interior of the casing. The circuit substrate A is fixedly mounted in the lid 1". Thus, the circuit substrate 1' can be removed out of the casing together with the lid 1" when the latter is demounted on the main body 1'.

The shielding effect of such a shield casing 1 is generally represented by:

Shielding Effect = Reflection Loss + Absorption Loss +

Multi-Reflection Loss − Correction Value where the reflection loss is one provided by the reflection of a part of electromagnetic wave off the boundary between the shield casing and a medium which has a different surge impedance and is placed in the path of propagation of the electromagnetic wave; the absorption loss is one provided by the attenuation of the electromagnetic wave entering and propagating the material of the shield casing, the absorption loss being consumed by current induced in the shield as Joule heat; and the multi-reflection loss is one created by reflections on the opposite boundaries of the material of the shield casing, the multi-reflection loss been capable of being neglected if the absorption loss is sufficiently large.

The aforementioned losses are determined from Schlutz's formula. However, the Schlutz's formula must be used on the premise that the shield member is infinitely planar without seam. Actually, thus, many correction values are required when the Schlutz's formula is used. Most of the correction values concern the shielding material and there are also correction values relating to the seam in the shielding member.

Thus, the shielding effect depends on the handling of seam even if shield casings having the same configuration are made of completely the same material. In the conventional circuit unit shown in FIGS. 9 and 10, which includes the slitted window 2 for externally exposing the end of the circuit substrate A, the magnitude of such correction values becomes increased. There is therefore a problem in that they cannot perform their shielding effects sufficiently.

This is because the slitted window 2 cannot shield electromagnetic waves having wavelength less than two times the length of the window. If electromagnetic waves having such wavelength enter the window 2, they will easily pass through the slitted window 2 to leak out of the shield casing. In the modern electronic instruments, particularly, the frequency of clocks used therein progressively increases. Another problem is frequently raised that electromagnetic waves of high frequency created from the circuit substrate A leak out of the shield casing directly through the window 2 thereof.

As shown in FIG. 11, the conventional circuit units may have a window 2 formed to have its width larger than the thickness of the circuit substrate A. In such case, more noise may leak out of the shield casing through the window 2.

In the conventional circuit units, furthermore, electric currents induced by the electromagnetic waves from the circuit substrate A act on the edges of said window 2 which in turn act as an antenna for re-radiating the noise externally. This phenomenon is called as "edge effect". This is because as the frequency of the electromagnetic waves increases, the cut end faces of the electrically conductive member act as a micro-split antenna.

From the foregoing, it is to be understood that the conventional circuit units will not provide any satisfactory shielding effect since they have relatively large correction values.

SUMMARY OF THE INVENTION

It is therefore an object of the present invention to provide an electromagnetic wave shield type circuit unit which can greatly reduce the leakage of electromagnetic waves out of the shield casing even if the circuit substrate is fixedly mounted within the shield casing with the terminal region of the substrate being externally exposed and to provide a TV game playing machine using the above-mentioned circuit unit.

To this end, the present invention provides an electromagnetic wave shield type circuit unit for preventing the external leakage of electromagnetic wave, comprising:

a circuit substrate from which the electromagnetic waves are produced;

an electromagnetic wave shield casing in which said circuit substrate is fixedly mounted by the use of mounting means;

the opposite sides of said circuit substrate each including a terminal region having a plurality of externally connecting terminals formed therein, a circuit region having a circuit formed therein and a mounting region between said terminal and circuit regions;

said mounting means including a pair of shield plates each having at least one strip-like portion which is fixedly mounted on said circuit substrate across the width thereof in the corresponding mounting region; and said circuit substrate being located between the strip-like portions of said shield plates and fixedly mounted in said electromagnetic wave shield casing with the terminal regions exposed externally.

The present invention also provides a TV game playing machine using an electromagnetic wave shield type circuit unit for preventing the external leakage of electromagnetic wave, said circuit unit comprising:

a circuit substrate from which the electromagnetic waves are produced;

an electromagnetic wave shield casing in which said circuit substrate is fixedly mounted by the use of mounting means;

the opposite sides of said circuit substrate each including a terminal region having a plurality of external connecting terminals formed therein, a circuit region having a circuit formed therein and a mounting region between said terminal and circuit regions;

said mounting means including a pair of shield plates each having at least one strip-like portion which is fixedly mounted on said circuit substrate across the width thereof in the corresponding mounting region; and said circuit substrate being located between the strip-like portions of shield plates and fixedly mounted in said electromagnetic wave shield casing with the terminal regions exposed externally, said plurality of externally connecting terminals being connected with any external circuit.

In such a manner, the present invention utilizes a pair of shield plates sandwiching the circuit substrate therebetween, the circuit substrate being fixedly mounted within the electromagnetic wave shield casing with the terminal regions thereof exposed externally.

Therefore, the exterior and interior of the shield casing will be connected with each other through a shield space surrounded by the two shield plates, rather than through a simple slit-like window as in the prior art. Thus, the electromagnetic waves can externally pass through the slitted window only after passed through the shield space surrounded by the two shield plates.

Most of the electromagnetic waves entering the shield space are repeatedly reflected and sufficiently attenuated between the two shield plates before they are radiated out of the shield casing, leading to the great reduction of the leakage of electromagnetic waves. In accordance with the present invention, particularly, the pair of shield plates are fixedly mounted on the circuit substrate at the opposite mounting regions thereof, so that the width of the shield space can be small-sized substantially as small as the thickness of the circuit substrate. The electromagnetic waves of higher frequency can be also shielded effectively by the shield casing according to the present invention.

In accordance with the present invention, further, the circuit substrate can have strip-like grounding electrode means formed therein at the mounting regions. Such strip-like grounding electrode means is preferably pressed against the shield plates. Thus, the impedance can be equal to about zero between each of the shield plates and the shield casing, so that the entire shield construction will have the same potential as that of the ground potential in the power source. Accordingly, electric current induced by the electromagnetic waves impinging on the material of the shield members can be rapidly attenuated so as to avoid various problems relating to the re-radiation of electromagnetic waves and so on in the prior art.

In the present invention, each of the shield plates is preferably of an L-shaped configuration which includes a first plate portion fixedly secured to the corresponding mounting region of the circuit substrate and a second plate portion fixedly mounted on the shield casing, the first plate portion being faced to the interior of the shield casing. In this case, the edge faces (cut edges) of the shield plates will be oriented to the interior of the shield casing such that even if these edge faces function as micro-split antenna means, the electromagnetic waves can be re-radiated into the interior of the shield casing without external leakage of noise.

DETAILED DESCRIPTION OF THE PREFERRED EMBODIMENTS

One preferred embodiment of the present invention will now be described as applied to a TV game playing machine.

Figure 1:
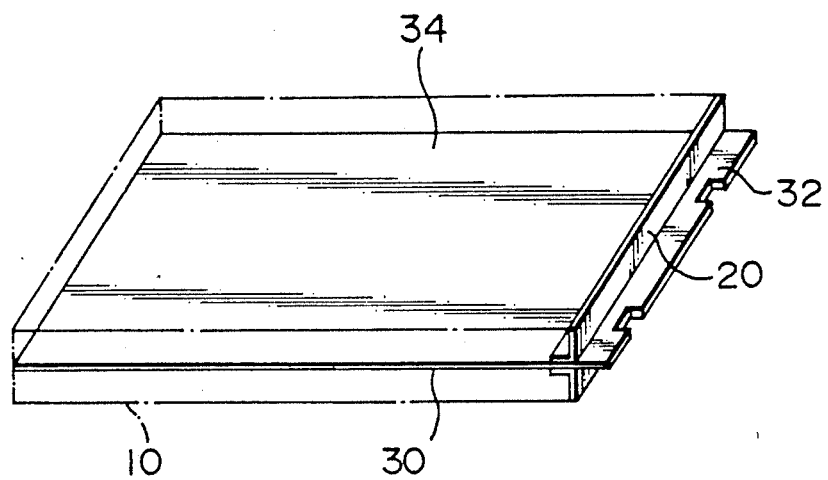
FIG. 1 is a perspective view of the entire construction of an electromagnetic wave shield type circuit unit constructed in accordance with the present invention.

Referring now to FIG. 1, there is shown an electromagnetic wave shield type circuit unit for use in the TV game playing machine relating to the present invention.

The circuit unit comprises an electromagnetic wave shield casing 10 and a TV game circuit substrate 30 fixedly mounted within the shield casing through a mounting member 20. The shield casing 10 is adapted to prevent electromagnetic waves produced by the circuit substrate 30 from leaking out of the shield casing 10.

Figure 2:
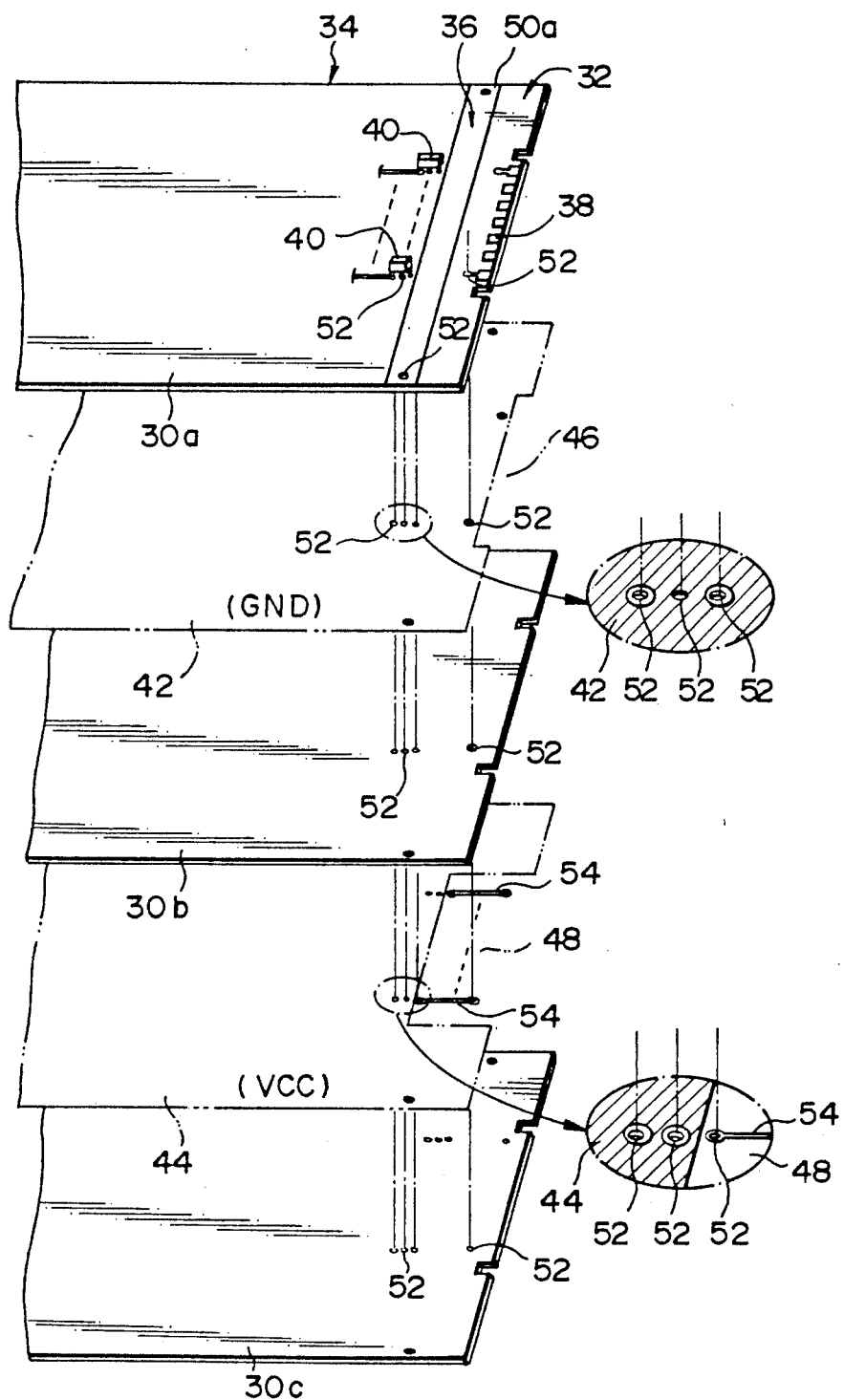
FIG. 2 is an exploded perspective view of a multi-layer circuit substrate used in the circuit unit shown in FIG. 1.

FIG. 2 shows, in an exploded state, a multi-layer circuit substrate used as said circuit substrate 30. Such multi-layer circuit substrate includes three layers 30a, 30b and 30c all of which are connected together to form one integral board.

Figure 3A:
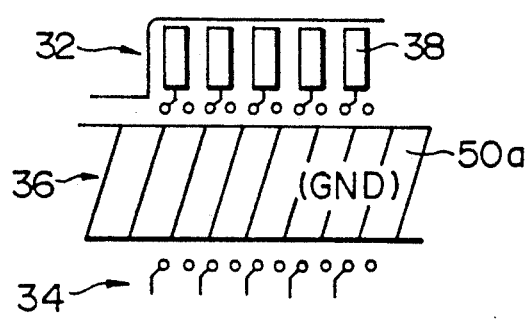
FIG. 3A being a view showing the side of the circuit substrate on which various parts are mounted and FIG. 3B being a view depicting the opposite side of the circuit substrate on which various parts are soldered.

Each of the first and third layers 30a and 30c includes, on one side, a terminal region 32 having a plurality of externally connecting terminals 38, a circuit region 34 on which various circuits are formed, and a strip-like mounting region 36 separating and extending between the terminal and circuit regions. The one side of the first layer 30a is sometimes called as "parts side" on which various electronic parts are mounted at the circuit region 34. The mounting region 36 of the first layer 30a includes a strip-like grounding electrode 50a formed therein and extending along the length thereof, as shown in FIG. 3A.

Figure 3B:
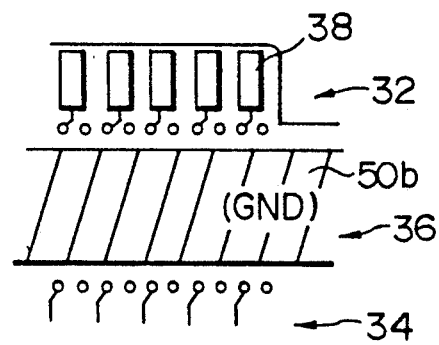
FIG. 3 illustrates the mounting region in the circuit substrate shown in FIG. 2.

The one side of the third layer 30c is sometimes called as "solder side" on which the leads of the electronic parts mounted on the parts side of the first layer 30a are soldered. As seen from FIG. 3B, the mounting region 36 of the third layer 30c also includes a strip-like grounding electrode 50b formed therein and extending along the length thereof.

In order to connect the externally connecting terminals 38 on the terminal region 32 with the electronic circuits on the circuit region 34, the circuit substrate 30 includes a plurality of through-holes 52 formed therein through the first and third layers 30a, 30c.

The second layer 30b includes a GND sub-layer 42 extending, on one side, substantially over the entire surface area and a VCC sub-layer 44 extending, on the opposite side, over substantially the entire surface area, these sub-layers 42 and 44 being shown by two-dot chain line in FIG. 2. The GND sub-layer 42 and the strip-like grounding electrode 50 are electrically connected with the grounding terminals of the externally connecting terminals 38 while the VCC sub-layer 44 is electrically connected with the corresponding terminals among the externally connecting terminals 38.

Furthermore, the externally connecting terminals 38 include signal input/output terminals which are to be connected with the circuit portions on the parts side of circuit region 34. To this end, the opposite side of the second layer 30b, that is, the side thereof on which the VCC sub-layer 44 is formed includes a plurality of leads 54 each of which is connected at one end with the corresponding one of the externally connecting terminals 38 through one through-hole 52. The other end of that lead 54 is connected with the corresponding input/output circuit on the circuit region 34 through another through-hole 52. In the illustrated embodiment, each of the input/output ends of the circuit region 34 are provided with a three-terminal EMI filter 40 for filtrating noises included in signal current or the like.

The three terminals of each of the EMI filter 40 are received into through-holes 52, one of these terminals being connected to one lead 54, another terminal being connected with the GND sub-layer 42. The remaining one of the terminals is connected to a circuit on the circuit region 34.

Figure 4:
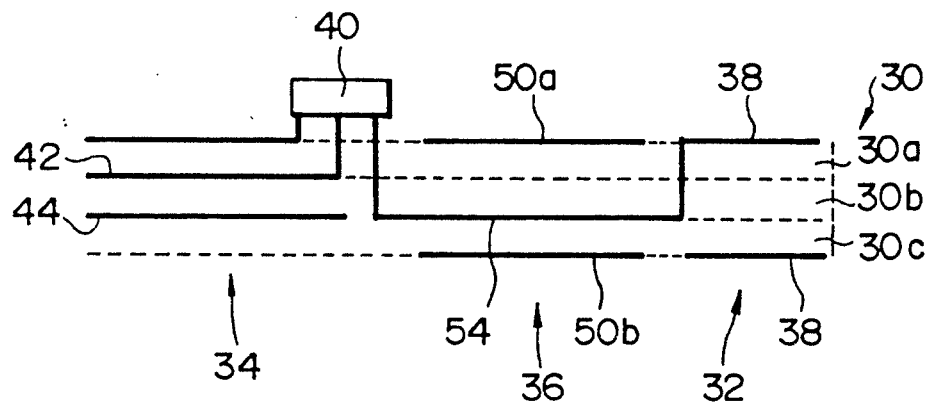
FIG. 4 illustrates a wiring in the mounting region of the circuit substrate shown in FIG. 2.

FIG. 4 schematically shows the cross-section of the mounting regions 36 of the circuit substrate 30. As seen from FIG. 4, the external terminals are connected with the circuits of the circuit region 34 through the lead 54 and EMI filter 40.

The mounting member 20 includes a pair of shield plates 22a and 22b between which the mounting regions 36 of the circuit substrate 30 are sandwiched from the opposite sides with the terminal regions 32 exposed externally. In such a condition, the circuit substrate 30 will be fixedly mounted within the shield casing 10.

Figure 5:
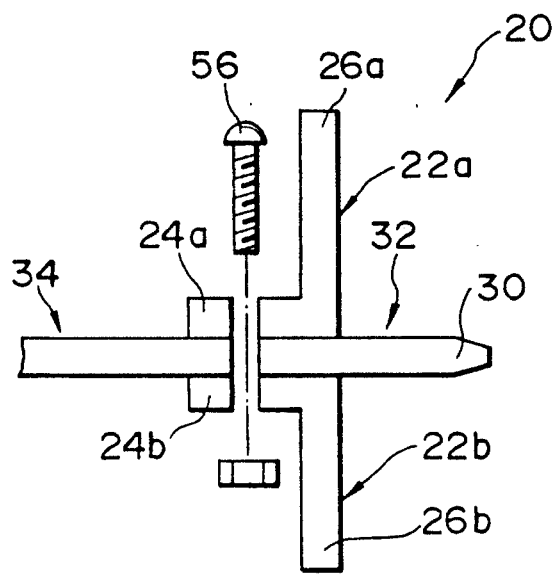
FIG. 5 illustrates the mounting of a pair of shield plates on the mounting regions of the circuit substrate.

In the illustrated embodiment, each of the shield plates 22a and 22b is of substantially an L-shaped configuration, which includes a first plate portion 24a or 24b fixed to the corresponding mounting region 36 with the end thereof oriented to the circuit region 34, as shown in FIG. 5. This fixation can be attained by any suitable means such as soldering. Alternatively, the first plate portion may be secured to the circuit substrate by means of such a screw 56 as also shown in FIG. 5.

In such a manner, the pair of shield plates 22a and 22b are fixedly mounted on the circuit substrate 30 to sandwich the mounting regions 36 from the opposite sides of the circuit substrate 30.

Figure 6:
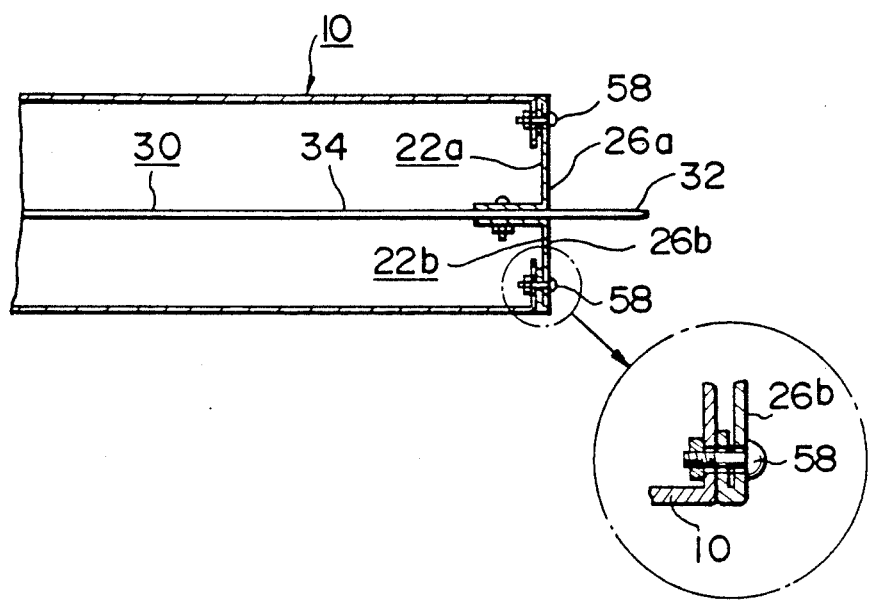
FIG. 6 is a cross-sectional view of the shield casing in which the circuit substrate is mounted.

As shown in FIG. 6, the fixation of the circuit substrate 30 with the shield casing 10 is accomplished by fixing the ends of the second plate portions 26a and 26b of the shield plates 22a and 22b to the open end of the shield casing 10 through screws 58 in such a situation that the circuit regions 34 of the circuit substrate are received within the shield casing 10. At this time, the ends of the second plate portions 26a and 26b are inwardly turned such that they will not function as micro-split antenna means for re-radiating noises externally.

Thus, the circuit unit of the illustrated embodiment will have the circuit substrate 30 fixedly mounted in the shield casing 10 with the terminal regions 32 thereof exposed externally.

The aforementioned embodiment of the present invention will function as follows:

Since the circuit unit includes the circuit substrate 30 integrally connected with the pair of shield plates 22a and 22b which are in turn screwed to the open end of the shield casing 10 as shown in FIG. 6, the circuit substrate 30 may be simply and easily mounted in the shield casing 10 with the terminal regions 32 exposed externally.

The circuit substrate 30 may be in its operative state when the externally connecting terminals 38 on the terminal regions 32 are connected with the power supply and other external circuits.

Figure 7:
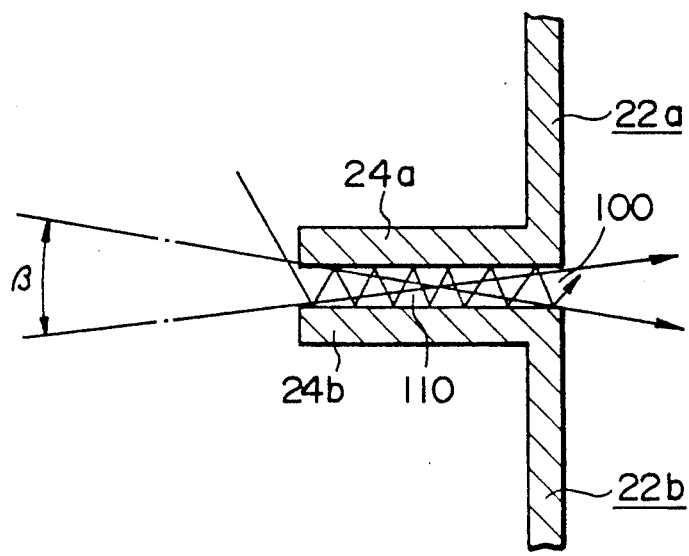
FIG. 7 illustrates electromagnetic waves leaking out of the shield casing through the mounting window formed therein.

Inside a slitted window 100 formed in the shield casing 10 to connect its interior and exterior with each other, there is formed a shield space 110 sandwiched by the plate portions 24a and 24b, as shown in FIG. 7.

Figure 11:
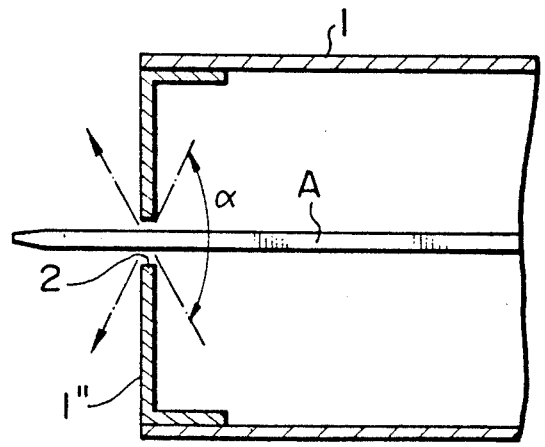

Thus, electromagnetic waves tending to leak out of the shield casing through the slitted window 100 can be greatly reduced for the following reasons:

(1) First of all, by providing the plate portions 24a and 24b inside of the slitted window 100, electromagnetic waves can be prevented from directly entering the slitted window 100 and also the angle of incidence can be sharply lowered. For example, if a slitted window is merely formed in the shield casing as shown in FIG. 11, the angle of incidence of electromagnetic waves directly entering the slitted window 2 is equal to $\alpha$. However, the present invention can reduce the angle of direct incidence to a smaller value $\beta$, as shown in FIG. 7.

(2) Secondly, the circuit unit of the present invention causes electromagnetic waves entering the shield space 110 to leak out of the shield casing 10 after they have been repeatedly reflected between the plate portions 24a and 24b and also repeatedly passed through the circuit substrate 30. Therefore, the electromagnetic waves will be progressively attenuated to reduce the external leakage of the electromagnetic waves.

In the illustrated embodiment, particularly, the plate portions 24a and 24b are in surface contact with the strip-like grounding electrodes 50 on the circuit substrate 30 to short-circuit the grounding terminals among the externally connecting terminals 38 on the terminal regions 32. Thus, the shield plates 22a and 22b surrounding the shield space 110 are grounded so that the electromagnetic waves will be attenuated by being repeatedly reflected between the plate portions 24a and 24b. Therefore, the external leakage of electromagnetic waves can be greatly reduced.

(3) Finally, the plate portions 24a and 24b on the shield plates 22a and 22b are fixedly mounted directly on the respective mounting regions 36 of the circuit substrate 30 whereas in the prior art circuit unit of FIG. 11, the slitted window 100 must be formed to have a width sufficiently larger than the thickness of the circuit substrate so as to avoid any contact of the shield casing with the circuit substrate. In accordance with the present invention, therefore, the dimensions of the slitted window 100 and shield space 110 can extremely reduced up to the thickness of the circuit substrate 30. Thus, the amount of electromagnetic waves entering the shield space 110 can be correspondingly reduced to decrease the leakage thereof out of the shield casing 10.

By utilizing many screws 56 or 58 (see FIG. 5) for fixing the shield members and for connecting the ground and the shield members, the transverse width of the slitted window 100 (transversely relative to the circuit substrate) can be divided into small sections each equal to the spacing between each adjacent screws 56. Thus, there may be reduced the external leakage of electromagnetic waves entering along the same plane as the slitted window 100.

In addition to the reduction of the external leakage of electromagnetic waves, the circuit unit of the illustrated embodiment can proved a return path for electric current induced in the shield casing 10 and in the shield plates 22a and 22b. Also by doing so, the external leakage of electromagnetic waves can be reduced.

For such a purpose, the opposite sides of the circuit substrate 30 in the illustrated embodiment include the strip-like grounding electrodes 50a and 50b which are in surface contact with the respective plate portions 24a and 24b of the shield plates 22a and 22b. Thus, each of the shield plates 22a, 22b and shield casing 10 is placed in short-circuiting with the ground of the power source (GND) through a low impedance to provide substantially the same potential. Thus, electric currents induced by electromagnetic waves entering the casing 10 and shield plates 22a, 22b can be rapidly attenuated to greatly reduce the externally re-radiation of electromagnetic waves.

In accordance with the present invention, the first plate portions 24a and 24b of each of the shield plates 22a and 22b are inwardly turned toward the interior of the shield casing 10 while at the same time the second plate portions 26a and 26b are also inwardly turned. This reduces the amount of electromagnetic waves re-radiated externally from the cut edges of these plate portions. More particularly, strong magnetic fields are created at the cut edges during the propagation of electric current induced in the shield by electromagnetic waves. If each of the cut edges has a sufficient length, it functions as an antenna (micro-split antenna) for re-radiating the electromagnetic waves. In order to avoid such a situation, the present invention places the cut edges of the shield plate portions inside of the shield casing 10 such that the external re-radiation of electromagnetic waves can be prevented.

In accordance with the present invention, therefore, the circuit unit can sharply reduce the external leakage of electromagnetic waves out of the shield casing 10 in comparison with the prior art, even if the circuit substrate 30 is received with the shield casing 10 with the terminal regions 32 exposed externally.

In accordance with the present invention, furthermore, each of the EMI filters 40 is placed on the circuit region 34 of the circuit substrate 30 at a position near the corresponding mounting region 36. This also prevents high frequency noises from leaking externally through the power or signal line. Each of the EMI filters 40 can similarly function even if it is placed near a position near the mounting area 36 of the terminal region 32.

It is to be understood that the present invention is not limited to the details of the illustrated embodiment and that many modifications and changes can be made within the concept of the present invention.

Figure 8A:
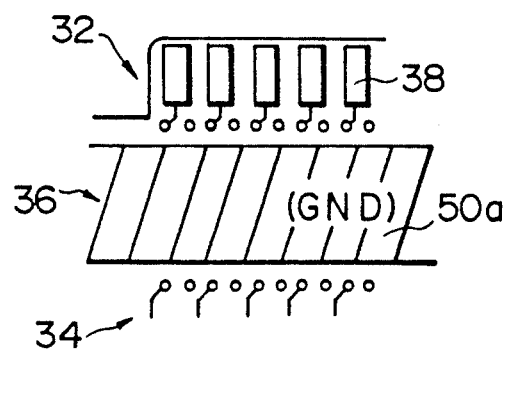
FIG. 8A showing the side of the circuit substrate on which various parts are mounted and FIG. 8B depicting the opposite side of the circuit substrate on which the parts are soldered.
Figure 8B:
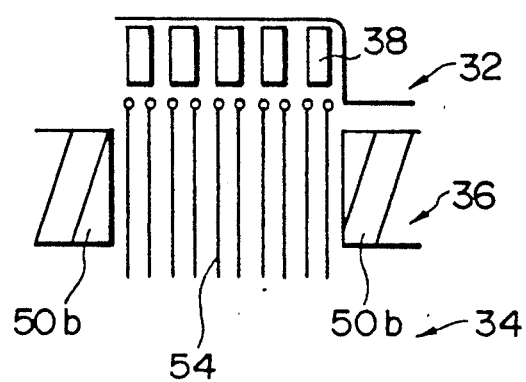
FIG. 8 illustrates another embodiment of the circuit substrate.
Figure 9:
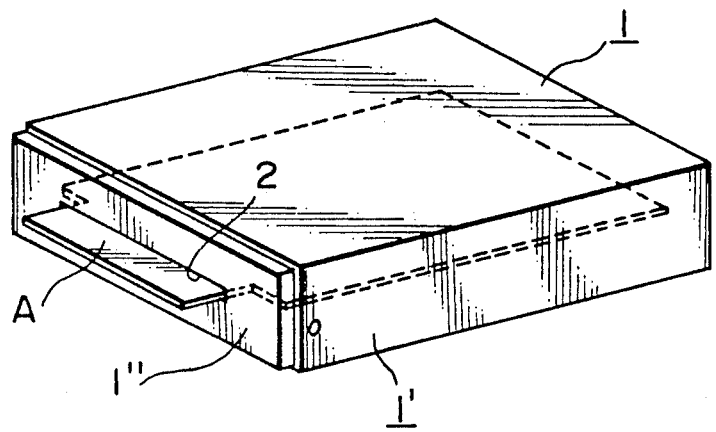
FIGS. 9–11 illustrate one of the conventional electromagnetic shield type circuit units.
Figure 10:
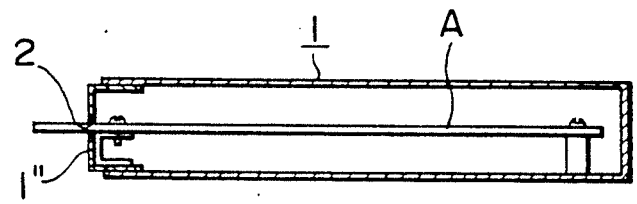

For example, the circuit substrate 30 may be a two-sided circuit substrate as shown in FIG. 8, in place of the multi-layer circuit substrate as shown in FIG. 2. FIG. 8A shows part of one side of such a two-sided circuit substrate while FIG. 8B shows part of the opposite side of the same.

Where such a two-sided circuit substrate is used, leads 54 connecting between the terminal region 32 and the circuit region 34 are placed on said opposite side of the circuit substrate 30, as shown in FIG. 8B. The strip-like grounding electrodes 50b are provided on the opposite sides of a group of leads 54.

If a pair of shield plates 22a and 22b as aforesaid are to be fixedly mounted on the circuit substrate 30, any suitably insulating material may be placed between each of the leads 54 and the first plate portion 24b and the shield plate 22b.

Although the aforementioned embodiment has been described as to the first plate portions 24a and 24b of the shield plates 22a and 22b which are made of electrically conductive sheet material, the present invention is not limited to such a construction and may be applied to any electrically conductive material of mesh construction.

Although the aforementioned embodiment has been described as to a TV game playing machine to which the present invention is applied, the present invention is not limited to such a TV game playing machine and may be applied to any other electronic instruments.

From the foregoing, it is to be understood that even if a circuit substrate is fixedly received within a shield casing with the terminal regions exposed externally in accordance with the present invention, the external leakage of electromagnetic waves out of the shield casing can be greatly reduced in an electromagnetic wave shield type circuit unit and a TV game playing machine utilizing such a circuit unit.

What is claimed is:

1. An electromagnetic wave shield type circuit unit for preventing the external leakage of electromagnetic wave, comprising:
   a circuit substrate from which the electromagnetic waves are produced;
   an electromagnetic wave shield casing in which said circuit substrate is fixedly mounted by the use of mounting means;
   said circuit substrate including, on at least one side, a terminal region having a plurality of externally connecting terminals formed therein and a circuit region having a circuit formed therein and, on the opposite sides, mounting regions one of which is located between said terminal and circuit regions;
   said mounting means including a pair of shield plates each having at least one strip-like portion which is fixedly mounted on said circuit substrate across the width thereof in the corresponding mounting region; and
   said circuit substrate being located between the strip-like portions of said shield plates and fixedly mounted in said electromagnetic wave shield casing with the terminal regions exposed externally.

2. An electromagnetic wave shield type circuit unit as defined in claim 1 wherein each of said shield plates is of a L-shaped configuration which comprises a first plate portion and a second plate portion, said first plate portion being fixedly mounted on the corresponding mounting region of said circuit substrate and said second plate portion being fixedly mounted on said shield casing.

3. An electromagnetic wave shield type circuit unit as defined in claim 2 wherein each of said shield plates is fixedly mounted on the corresponding mounting region of said circuit substrate with the first plate portion thereof faced to the interior of said shield casing.

4. An electromagnetic wave shield type circuit unit as defined in claim 1 wherein said circuit substrate includes a strip-like grounding electrode on at least one of the mounting regions, said strip-like grounding electrode being in surface contact with the corresponding shield plate.

5. An electromagnetic wave shield type circuit unit as defined in claim 3 wherein said circuit substrate includes a strip-like grounding electrode on at least one of the mounting regions, said strip-like grounding electrode being in surface contact with the corresponding shield plate.

6. An electromagnetic wave shield type circuit unit as defined in claim 1 wherein said circuit substrate is a multi-layer circuit substrate in the form of a board consisting of at least three laminated layers, said multi-layer circuit substrate being formed with said terminal, circuit and mounting regions, and further comprising lead means on the intermediate layer in said multi-layer circuit substrate for connecting circuit means on said circuit region with externally connecting terminal means on said terminal region.

7. An electromagnetic wave shield type circuit unit as defined in claim 6 wherein said multi-layer circuit substrate includes a strip-like grounding electrode provided on at least one of said mounting regions, said strip-like grounding electrode being in surface contact with the corresponding shield plate.

8. An electromagnetic wave shield type circuit unit as defined in claim 7 wherein the intermediate layer in said multi-layer circuit substrate includes a grounding GND sub-layer formed therein at least on one side, said GND sub-layer and said strip-like grounding electrode being connected with the grounding terminal among said externally connecting terminals.

9. An electromagnetic wave shield type circuit unit as defined in claim 1 wherein EMI filters are located on the circuit or terminal region of at least one side of said circuit substrate at a position near the mounting region.

10. An electromagnetic wave shield type circuit unit as defined in claim 2 wherein said circuit substrate is a multi-layer circuit substrate in the form of a board consisting of at least three laminated sub-layers, said multi-layer circuit substrate being formed with said terminal, circuit and mounting regions, and further comprising lead means on the intermediate layer in said multi-layer circuit substrate for connecting circuit means on said circuit region with externally connecting terminal means on said terminal region.

11. An electromagnetic wave shield type circuit unit as defined in claim 10 wherein said multi-layer circuit substrate includes a strip-like grounding electrode provided on at least one of the mounting regions, said strip-like grounding electrode being in surface contact with the corresponding shield plate.

12. An electromagnetic wave shield type circuit unit as defined in claim 11 wherein the intermediate layer in said multi-layer circuit substrate includes a grounding GND sub-layer formed therein at least on one side, said GND sub-layer and said strip-like grounding electrode being connected with the grounding terminal among said externally connecting terminals.

13. An electromagnetic wave shield type circuit unit as defined in claim 6 wherein EMI filters are located on the circuit or terminal region of at least one side of said circuit substrate at a position near the mounting region.

14. An electromagnetic wave shield type circuit unit as defined in claim 3 wherein each of said shield plates is fixedly mounted in said shield casing with the second plate portion thereof turned inwardly toward said shield casing.

15. An electromagnetic wave shield type circuit unit as defined in claim 10 wherein EMI filters are located on the circuit or terminal region of at least one side of said circuit substrate at a position near the mounting region.

16. An electromagnetic wave shield type circuit unit as defined in claim 14 wherein said circuit substrate includes a strip-like grounding electrode provided on at least one of the mounting regions, said strip-like grounding electrode being in surface contact with the corresponding shield plate.

17. An electromagnetic wave shield type circuit unit as defined in claim 16 wherein said circuit substrate is a multi-layer circuit substrate in the form of a board consisting of at least three laminated layers, said multi-layer circuit substrate being formed with said terminal, circuit and mounting regions, and further comprising lead means on the intermediate layer in said multi-layer circuit substrate for connecting circuit means on said circuit region with externally connecting terminal means on said terminal region.

18. An electromagnetic wave shield type circuit unit as defined in claim 17 wherein the intermediate layer in said multi-layer circuit substrate includes a grounding GND sub-layer formed therein at least on one side, said GND sub-layer and said strip-like grounding electrode being connected with the grounding terminal among said externally connecting terminals.

19. An electromagnetic wave shield type circuit unit as defined in claim 17 wherein EMI filters are located on the circuit or terminal region of at least one side of said circuit substrate at a position near the mounting region.

20. A TV game playing machine using an electromagnetic wave shield type circuit unit for preventing the external leakage of electromagnetic wave, said circuit unit comprising:
- a circuit substrate from which the electromagnetic waves are produced;
- an electromagnetic wave shield casing in which said circuit substrate is fixedly mounted by the use of mounting means;
- said circuit substrate including, on at least one side, a terminal region having a plurality of externally connecting terminals formed therein and a circuit region having a circuit formed therein and, on the opposite sides, mounting regions one of which is located between said terminal and circuit regions;
- said mounting means including a pair of shield plates each having at least one strip-like portion which is fixedly mounted on said circuit substrate across the width thereof in the corresponding mounting region; and
- said circuit substrate being located between the strip-like portions of said shield plates and fixedly mounted in said electromagnetic wave shield casing with the terminal regions exposed externally.

* * * * *